United States Patent [19]

Matsumoto

[11] Patent Number: 4,853,633

[45] Date of Patent: Aug. 1, 1989

[54] MAGNETIC HEAD ELECTROMAGNETIC CONVERSION EFFICIENCY MEASURING METHOD AND ELEMENT THEREFOR

[75] Inventor: Takashi Matsumoto, Tokyo, Japan

[73] Assignee: Fuji Photo Film Co., Ltd., Kanagawa, Japan

[21] Appl. No.: 21,282

[22] Filed: Mar. 3, 1987

[30] Foreign Application Priority Data

Mar. 5, 1986 [JP] Japan ................................ 61-46397

[51] Int. Cl.$^4$ .................... G01R 33/06; G01R 33/12; G11B 5/39
[52] U.S. Cl. .................................. 324/210; 324/235; 324/252; 338/32 R; 360/113
[58] Field of Search ............... 324/200, 210, 212, 252, 324/235; 338/32 R; 360/113; 357/27

[56] References Cited

U.S. PATENT DOCUMENTS

| | | | |
|---|---|---|---|
| 3,162,805 | 12/1964 | Robertson | 324/208 X |
| 3,947,889 | 3/1976 | Lazzari | 338/32 R X |
| 4,012,781 | 3/1977 | Lin | 324/252 X |
| 4,179,720 | 12/1979 | Miura | 360/113 |
| 4,315,291 | 2/1982 | Lazzari | 360/113 |
| 4,432,028 | 2/1984 | Desserre et al. | 324/252 X |
| 4,589,041 | 5/1986 | Voegeli | 324/252 X |
| 4,603,365 | 7/1986 | Nakamura | 338/32 R X |

*Primary Examiner*—Gerard R. Strecker
*Attorney, Agent, or Firm*—Sughrue, Mion, Zinn, Macpeak & Seas

[57] ABSTRACT

A magnetic head characteristic measuring device for determining the recording and reproduction efficiencies of a magnetic head, which uses an MR block consisting of plural parallel magnetoresistive elements disposed on opposite sides of a reference plane aligned with the center of the gap of the magnetic head. The MR elements detect a change in the vertical component of the magnetic field caused by a change in a leakage magnetic field generated in the gap, to gauge the recording efficiency of the head. The measuring device also includes a further MR element or other conductor capable of generating a test magnetic field when supplied with a current. When this test magnetic field is being generated, a measurement of the response of the magnetic head is taken in order to gauge the reproduction efficiency of the same.

15 Claims, 2 Drawing Sheets

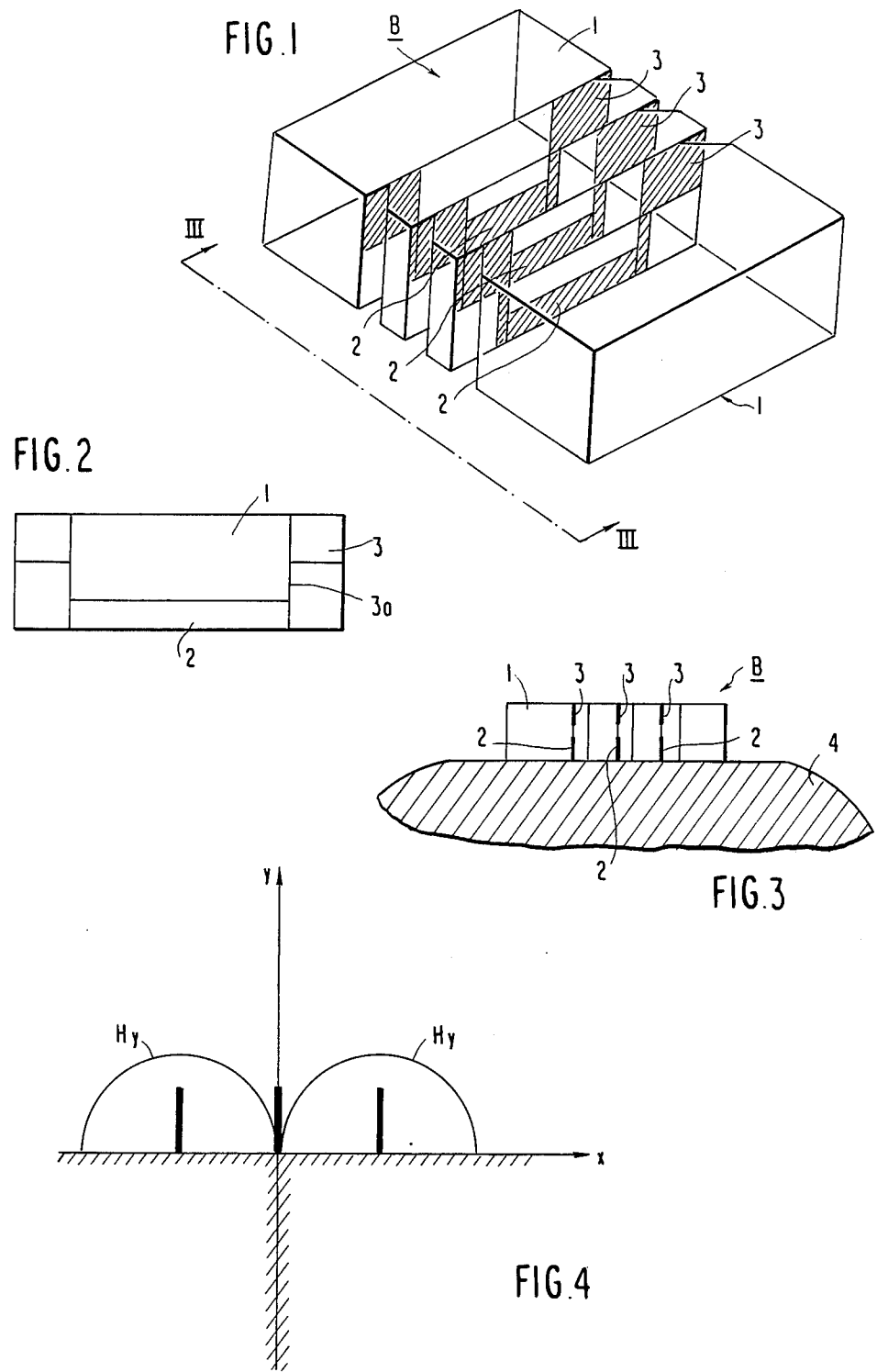

MAGNETIC HEAD ELECTROMAGNETIC CONVERSION EFFICIENCY MEASURING METHOD AND ELEMENT THEREFOR

FIELD OF THE INVENTION

This invention relates to a magnetic head characteristic measuring device for measuring the electromagnetic conversion efficiencies, i.e., the recording efficiency and reproduction efficiency, of a magnetic head.

BACKGROUND OF THE INVENTION

To determine the characteristics of a magnetic head, the electromagnetic conversion efficiencies including recording efficiency and reproduction efficiency are measured. The measurement is conventionally carried out under actual operating conditions, by recording from the magnetic head to a recording medium, and by using the magnetic head to reproduce a signal from the recording medium.

However, the above method requires a substantial expenditure of time in that it is required to physically place the magnetic recording medium in moving contact with the head and achieve an actual operating condition. Furthermore, the measuring operation must be performed by an operator skilled in this kind of measurement. It has also been difficult to obtain an exact measurement result, since magnetic recording media generally exhibit wide dispersion in their magnetic characteristics, and, because the magnetic recording medium is moved at a high speed relative to the magnetic head, a slight fluctuation in spacing occurs between the magnetic head and the recording medium.

OBJECT AND SUMMARY OF THE INVENTION

With a view to obviate all of the defects of the conventional methods for measuring the electromagnetic conversion efficiencies of a magnetic head, it is a primary object of the present invention to provide a magnetic head characteristic measuring device which can provide a highly precise measurement in a reduced measuring time, without need of a skilled operator.

In accordance with the present invention, there is provided a magnetic head characteristic measuring device comprising first and second thin films consisting of MR (magneto-restrictive) elements of the same shape, disposed parallel to and equidistant from a reference plane. There is further provided a magnetic head characteristic measuring system according to the present invention, comprising first and second thin films consisting of MR elements of the same shape, disposed parallel to and equidistant from a reference plane, the first and second thin films being respectively connected to regulated power supplies and to a measuring instrument through a preamplifier.

By aligning the reference plane with the center of the magnetic head gap, a change in the vertical component of the magnetic field caused by a variation in a leakage magnetic field occurring in the gap can be detected by the MR elements. The values measured by the two MR elements are arithmetically averaged to obtain a measurement with improved accuracy.

BRIEF DESCRIPTION OF THE DRAWINGS

FIG. 1 is a schematic view of an MR block,

FIG. 2 is a side view of a single element of the MR block,

FIG. 3 is a side view of the MR block as viewed along line III—III in FIG. 1,

FIG. 4 is a schematic view showing the range of measurement,

DETAILED DESCRIPTION OF THE PREFERRED EMBODIMENTS

Figure 5:
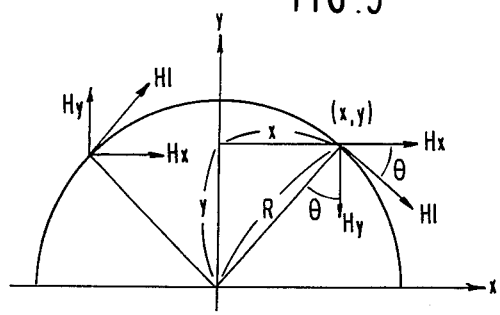
FIG. 5 is a schematic view showing vertical and horizontal components of the magnetic field.

An embodiment according to the present invention will now be described with reference to the drawings. FIG. 1 is a schematic view showing an example of the magnetic head characteristic measuring device according to the present invention. Referring to FIG. 1, the measuring device includes thin films consisting of MR (magneto-resistive) elements 2 and electrodes 3 attached to side surfaces of substrates 1 made of glass or the like. As shown in FIG. 1, the substrates are provided in four sections. One side surface of three of the substrate sections 1 is provided with an attached MR element 2 consisting of Permalloy, for example, and having a very small thickness on the order of about 500 angstroms. Both ends of the strip or belt-like MR elements 2 are connected to electroconductive films 3a, which are further connected to the electrodes 3. As shown in FIG. 2, the MR elements 2 are disposed on the lower side surfaces of the substrate sections 1, and the electrodes 3 are disposed at both ends of the upper side surfaces of the substrate sections 1.

The MR elements 2 attached to the three substrate sections are disposed parallel to each other, such that the two MR elements at the ends (i.e., at either side of the device) are positioned equidistant from the central MR element 2. Therefore, the thicknesses of the two substrate sections 1 disposed between the three MR elements 2 must be exactly equal. The other substrate section 1 with the MR element 2 attached thereto, and a retaining substrate (on the right in FIG. 1) are disposed on either side of the two central substrates 1.

Thus, the magnetic head characteristic measuring device shown in FIG. 1 consists of an MR block B having the three MR elements 2 disposed parallel to each other, and sandwiched between substrates 1 made of glass or the like. Referring to FIG. 1, the sides of the substrates 1 facing the exposed sides of electrodes 3 are partly cut away to reveal the electrodes 3 to allow for electrical connection. Further, the back surfaces of the substrates 1, which contact with a magnetic head 4 (FIG. 3), are finished to a mirror surface (mirror-finished).

The operation of the measuring device according to the present invention having the structure shown in FIGS. 1 and 2 will now be described. The MR element itself has a property such that it varies its electrical resistance upon sensing a magnetic field in the vertical direction in FIG. 1. When the two MR elements 2 at either side are supplied with electrical currents of predetermined values and the MR elements 2 are placed in a magnetic field, the electrical currents will vary according to the intensity of the magnetic field and can be detected to obtain a voltage or a current proportional to a change in the magnetic field. As shown in FIG. 3, the MR elements 2 are placed on a magnetic head 4, so that the mirror-finished back surface of the MR element supporting substrates 1 and the electrodes 3 contacts with the sliding surface of the magnetic head 4. The central MR element 2 is aligned with the center of the gap of the magnetic head 4. With this arrangement, changes in the above noted electrical currents are measured to determine the intensity of the magnetic field (specifically, the vertical component of the magnetic field), or, a variation in the same, generated by the magnetic head 4. Thus, the recording efficiency is measured. In this case, the central MR element 2 is used for positioning the MR element block relative to the gap, and the values measured by the two MR elements 2 at either end are arithmetically averaged to eliminate errors due to misalignment of the elements 2 with respect to the magnetic head 4.

Next, the function of the central MR element 2 will be described in more detail. As noted above, in measuring the recording efficiency, the central MR element 2 is sued for positioning the MR element block relative to the gap. In measuring the reproduction efficiency, the central element is not used as a magneto-resistive element per se, but rather as a magnetic field generating element. Specifically, an electrical current is passed through the central MR element 2, the magnetic field generated by the current is applied to the magnetic head, and a voltage induced in the magnetic head is detected by a coil, thereby obtaining a measure of the reproduction efficiency of the head. In this case, since the central MR element 2 is used as a magnetic field generating element, an electroconductive wire or film can be used in place of the MR element 2. However, for simplicity of production, the central MR element 2 can be the same as the MR elements 2 at the ends.

The proper positioning of the MR elements 2 at the ends, or the thickness of the substrates 1 sandwiched between the MR elements 2, will now be described with reference to FIGS. 4 and 5. FIG. 5 is a graphic representation showing one of the equimagnetic surfaces with the x axis positioned on the sliding surface (i.e., the magnetic media contacting surface, in use) of the magnetic head and the y axis at the center of the gap of the magnetic head. Where H is the intensity of the magnetic field at a point (x, y) on the equimagnetic surface, there holds a relation between H and the magnetomotive force NI as follows.

$$H = \frac{NI}{\pi R}$$

The vertical component Hy of the magnetic field H as sensed by the MR elements is given by $$Hy = H \sin \Theta$$

Since $\sin \Theta = x/R$, the following equation results:

$$Hy = H \cdot \frac{x}{R} = H \cdot \frac{x}{\sqrt{x^2 + y^2}} = \frac{NIx}{\pi(x^2 + y^2)}$$

The minimum value of Hy that can be detected by the MR elements is Hc, such that the vertical component Hy within the range of $Hc \leq Hy$ may be detected. Thus, the following equations are obtained:

$$Hc = \frac{NIx}{\pi(x^2 + y^2)}$$

$$x - \frac{NI}{\pi Hc} \cdot x + y^2 \leq 0$$

-continued $$\left(x - \frac{NI}{2\pi Hc}\right)^2 + y^2 \leq \left(\frac{NI}{2\pi Hc}\right)^2$$

As a result, when $NI/2\pi Hc$ is represented by r, a condition of $y > 0$ is met within a circle with a radius of r around a point (r, 0). When $H < 0$, $y > 0$ within a circle with a radius of r around a point (−r, 0). Thus, as shown in FIG. 4, the right and left semicircles around the gap constitute the detection range for the vertical component Hy, and the MR elements 2 at either end must be located within this range. Since, in practice, the intensity of the magnetic field increases as the MR elements 2 are brought closer to the gap of the magnetic head, the MR elements 2 can be located as close as possible to the gap as mechanically allowable in terms of the thicknesses of the substrates 1 and other factors, within the range determined by r.

Figure 6:
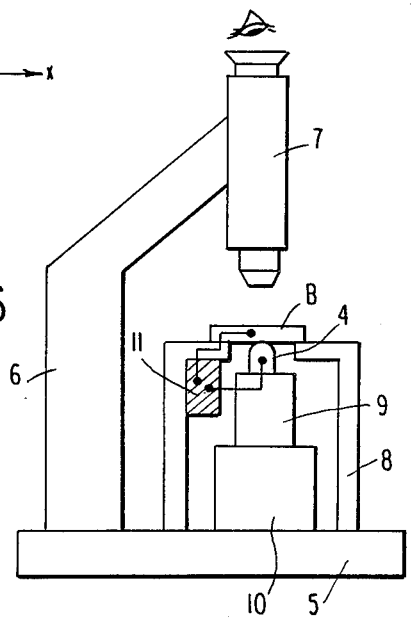
FIG. 6 is a schematic view showing the entire measuring device.

Next, the overall system of the head characteristic measuring device according to the present invention will be described with reference to FIG. 6. Referring to FIG. 6, a microscope 7 is disposed on a base 5 through a support 6. Between the microscope 7 and the base 5, there are disposed a support 8 on the base 5, which supports the MR block, a stage 9 on a table 10, on which the magnetic head 4 to be measured is placed, and a measuring circuit 11 which is shown in detail in FIG. 7. For measurement, the MR block B and the magnetic head 4 should first be aligned with each other. This is accomplished by causing the mirror-finished back surface of the MR block B to contact the magnetic head 4 placed on the stage 9 and, while observing with the microscope through the surface of the MR block, adjusting the magnetic head 4 so that the gap line of the magnetic head 4 is aligned with the MR element or the conductor located at the center of the MR block B. In this case, the adjustment is performed by moving the magnetic head 4 using an adjusting mechanism for adjusting the X, Y and Z coordinates, a goniometer for adjusting rotational angles $\theta x$ and $\theta y$, and a rotating mechanism for adjusting the rotational angle $\theta z$. Further, as the adjustment of the central MR element is carried out while observing the head and the block B under the microscope, the substrates 1 must be made of a transparent material so that the gap line is visible.

Figure 7:
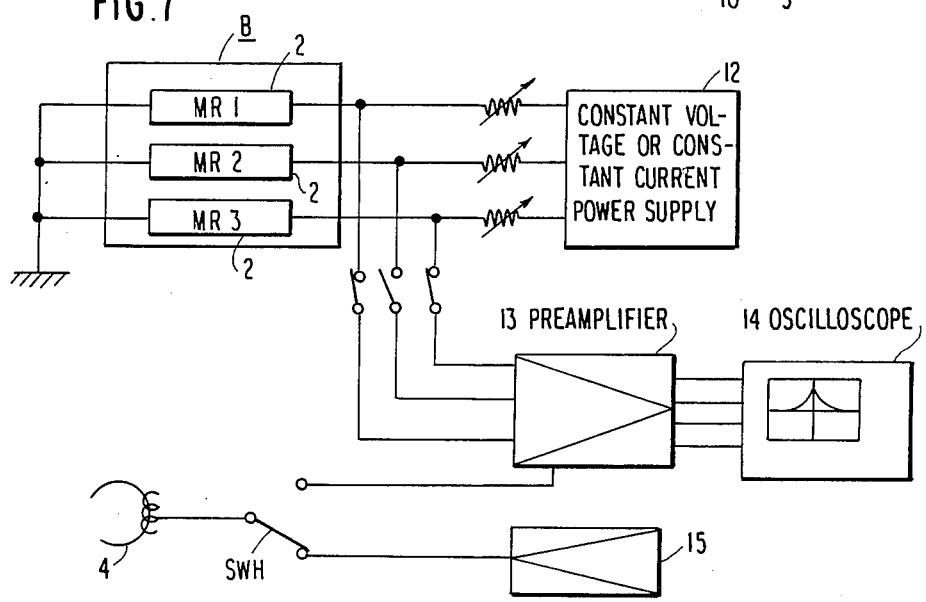
FIG. 7 is a block diagram of a measuring circuit.

To determine reproduction efficiency, a measuring current is applied to the central MR element of the MR block B to generate a magnetic field in the gap of the magnetic head 4 and a signal generated at terminals of the magnetic head 4 is passed through a preamplifier and is observed using an oscilloscope. Referring to FIG. 7 which shows the measuring circuit, a switch SWH is switched to the upper terminal, and MR 2, which is the central MR element, is energized by a constant-current power supply or a constant-voltage power supply. The signal at the central MR element 2 is outputted to an oscilloscope 14 via the (then closed) associated MR 2 lead switch and preamplifier 13. At the same time, the magnetic field generated by the MR element MR 2 is received by the magnetic head 4, and a signal generated by the magnetic head 4 is outputted through the preamplifier to the oscilloscope 14. Thus, the reproduction efficiency is determined from the ratio of the signals input to the oscilloscope 14.

To determine the recording efficiency, a current signal is applied from a recording current amplifier or recording voltage amplifier 15 to the magnetic head 4. In this case, the MR lead switches and the switch SWH are in the position shown. The vertical component Hy (shown in FIG. 5) of the magnetic field from the magnetic head 4 is measured by MR elements MR1 and MR3. The vertical component Hy is measured as a change in current, which is passed through the preamplifier 13 and displayed on the oscilloscope 14. Thus, the recording characteristics of the magnetic head 4 can be obtained by reading the oscilloscope 14. In this case, since the change in resistance of the MR elements MR1 and MR2 is proportional to the magnetic field applied, different types of magnetic heads with the same gap width can also be measured.

The magnetic head characteristic measuring device according to the present invention, as described above, uses an MR block consisting of spaced parallel MR elements. With this device, the electromagnetic conversion efficiencies of the head can be directly measured, with no need of actual operation of the head with a recording media. The measurement may be made in a reduced time even yb an unskilled operator, thereby providing a precision measurement while avoiding errors due to variations in the traditional recording media and spacing fluctuations.

I claim:

1. A method for measuring characteristics of a magnetic head, comprising the steps of: providing a sensing element comprising a substrate having at least two parallel surfaces,
   first and second thin film magnetoresistive elements varying in resistance in response to a local magnetic field, said first and second thin film magnetoresistive elements being disposed on
   respective ones of said parallel surfaces, said parallel surfaces being jointly parallel to a reference plane and each being spaced a predetermined distance from said reference plane on opposite sides of said reference plane; placing said sensing element adjacent a gap of said magnetic head; aligning said reference plane with a center of said gap using aligning aiding means provided on said reference plane; driving said magnetic head; and measuring resistances of said first and second thin film magnetoresistive elements.

2. The method as claimed in claim 1, wherein said gap of aligning said reference plane with a center of a gap of said magnetic head comprises the steps of: providing a conductor on said reference plane; and passing a current through said conductor.

3. The method as claimed in claim 1, wherein said conductor comprises a third thin film magnetoresistive element.

4. The method as claimed in claim 1, wherein said conductor comprises a thin film conductor.

5. The method as claimed in claim 1, wherein said thin film magnetoresistive elements are connected at ends thereof to electrodes disposed on respective ones of said parallel surfaces of said substrate.

6. The method as claimed in claim 5, wherein said substrate has a polished first surface, and wherein said step of placing said sensing element adjacent said magnetic head comprises placing said first surface of said surface in contact with a sliding surface of said magnetic head.

7. The method as claimed in claim 6, wherein said substrate comprises a plurality of substrate sections stacked so as to cause said thick film elements to be disposed parallel to each other.

8. A method for measuring characteristics of a magnetic head, comprising the steps of: disposing first and second thin film magnetoresistive elements of the same shape parallel to and on opposite sides of a reference plane with a predetermined spacing therebetween; locating said first and second thin films within a magnetic field produced by said magnetic head symmetrically with respect to a gap of said magnetic head; connecting each of said first and second thin films to a regulated power supply so as to pass a current of a predetermined value through each of said thin films; and detecting changes in said predetermined current in the presence of the magnetic field produced by said magnetic head.

9. The method as claimed in claim 8, wherein said step of locating said first and second thin films within a magnetic field produced by said magnetic head symmetrically with respect to a gap of said magnetic head comprises the steps of: providing a third thin film element disposed in said reference plane; connecting said third thin film to said regulated power supply so as to pass a predetermined current therethrough to generate a predetermined magnetic field; and comparing a signal at said third thin film with a signal generated by said magnetic head in response to said predetermined magnetic field.

10. A method for measuring characteristics of a magnetic head, comprising the steps of: providing a sensing element comprising a substrate having at least three parallel side surfaces, one of said side surfaces constituting a central surface disposed in a reference plane, said side surfaces being equidistant from one another, first and second thin film magnetoresistive elements disposed on first and second ones of said side surfaces other than said central surface, said first and second elements being identically shaped, and electrode surfaces disposed on said substrate and being electrically connected to ends of said first and second elements; connecting one of said electrode surfaces of each element being to a power supply; positioning said substrate symmetrically with respect to a gap of said magnetic head; driving said magnetic head; and measuring a change in an electrical characteristic of said first and second elements under the influence of a magnetic field generated by said magnetic head.

11. The method as claimed in claim 10, wherein a film conductor is disposed on said central surface, and further comprising the steps of: passing a current through said thin film conductor for generating a test magnetic field; and measuring an electrical signal developed by said magnetic head in response to said test magnetic field.

12. The method as claimed in claim 10, wherein said substrate comprises a series of substrate sections of transparent material stacked in a side-to-side fashion.

13. The method as claimed in claim 10, wherein said electrode surfaces are disposed on said side surfaces substantially adjacent to said first and second elements, respectively.

14. The method as claimed in claim 10, wherein said step of positioning said substrate means symmetrically with respect to a gap of said magnetic head comprises contacting a first surface of said substrate with a front surface of said magnetic head such that said reference plane is aligned with a gap line of said magnetic head.

15. A method for measuring characteristics of a magnetic head, comprising the steps of: providing a sensing element comprising a substrate having at least two parallel surfaces, a first thin film magnetoresistive element disposed on one of said parallel surfaces, a second thin film magnetoresistive element disposed on another of said parallel surfaces, said parallel surfaces being jointly parallel to a reference plane and each being spaced on opposite sides of said reference plane, said substrate including a back surface disposed generally perpendicular to said parallel surfaces and having a smooth mirror finished surface texture; disposing said sensing element adjacent said magnetic head such that said back surface uniformly contacts a front surface of said magnetic head; and aligning said reference plane with a gap of said magnetic head.

* * * * *